(12) United States Patent
Kalnitsky et al.

(10) Patent No.: US 11,742,236 B2
(45) Date of Patent: Aug. 29, 2023

(54) STRUCTURE AND METHOD FOR ENHANCING ROBUSTNESS OF ESD DEVICE

(71) Applicant: Taiwan Semiconductor Manufacturing Co., Ltd., Hsinchu (TW)

(72) Inventors: Alexander Kalnitsky, San Francisco, CA (US); Jen-Chou Tseng, Jhudong Township (TW); Chia-Wei Hsu, New Taipei (TW); Ming-Fu Tsai, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 125 days.

(21) Appl. No.: 17/106,553

(22) Filed: Nov. 30, 2020

(65) Prior Publication Data

US 2021/0082743 A1 Mar. 18, 2021

Related U.S. Application Data

(62) Division of application No. 16/021,200, filed on Jun. 28, 2018, now Pat. No. 10,854,501, which is a division of application No. 14/596,339, filed on Jan. 14, 2015, now Pat. No. 10,026,640.

(60) Provisional application No. 62/065,200, filed on Oct. 17, 2014.

(51) Int. Cl.
*H01L 21/762* (2006.01)
*H01L 27/02* (2006.01)
*H01L 29/06* (2006.01)
*H01L 29/73* (2006.01)
*H01L 29/66* (2006.01)

(52) U.S. Cl.
CPC .... *H01L 21/76224* (2013.01); *H01L 27/0259* (2013.01); *H01L 29/0649* (2013.01); *H01L 29/66234* (2013.01); *H01L 29/73* (2013.01)

(58) Field of Classification Search
CPC .... H01L 27/0259–0262; H01L 29/0649–0653
See application file for complete search history.

(56) References Cited

U.S. PATENT DOCUMENTS

| 6,344,412 | B1 * | 2/2002 | Ichikawa | H01L 21/76801 438/681 |
| 6,576,961 | B1 * | 6/2003 | Gupta | H01L 27/0262 257/357 |
| 2013/0208379 | A1 * | 8/2013 | Wang | H01L 29/87 361/56 |
| 2013/0277745 | A1 | 10/2013 | Tsai et al. | |
| 2015/0187752 | A1 | 7/2015 | Salman et al. | |

* cited by examiner

*Primary Examiner* — Amar Movva
(74) *Attorney, Agent, or Firm* — Slater Matsil, LLP

(57) ABSTRACT

Methods and devices are provided herein for enhancing robustness of a bipolar electrostatic discharge (ESD) device. The robustness of a bipolar ESD device includes providing an emitter region and a collector region adjacent to the emitter region. An isolation structure is provided between the emitter region and the collector region. A ballasting characteristic at the isolation structure is modified by inserting at least one partition structure therein. Each partition structure extends substantially abreast at least one of the emitter and the collector regions.

20 Claims, 5 Drawing Sheets

STRUCTURE AND METHOD FOR ENHANCING ROBUSTNESS OF ESD DEVICE

PRIORITY CLAIM AND CROSS-REFERENCE

This application is a divisional of U.S. patent application Ser. No. 16/021,200, filed on Jun. 28, 2018, which is a divisional of U.S. patent application Ser. No. 14/596,339, filed on Jan. 14, 2015, now U.S. Pat. No. 10,026,640 issued on Jul. 17, 2018, which claims priority to U.S. Provisional Patent Application No. 62/065,200, filed on Oct. 17, 2014, which applications are incorporated by reference herein in their entireties.

TECHNICAL FIELD

The present invention relates generally to semiconductor devices, and, more particularly, to a structure and method that utilize a profile optimization mechanism to improve a turn-on characteristic of an ESD protection device.

BACKGROUND

Electrostatic protection is one important issue with integrated circuits, especially in high voltage applications. Since the electrostatic charge is often accompanied with a relatively high voltage (may be thousands of volts), electrostatic discharge (ESD) protection circuits are often required to protect semiconductor device from being damaged by the electrostatic charge.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
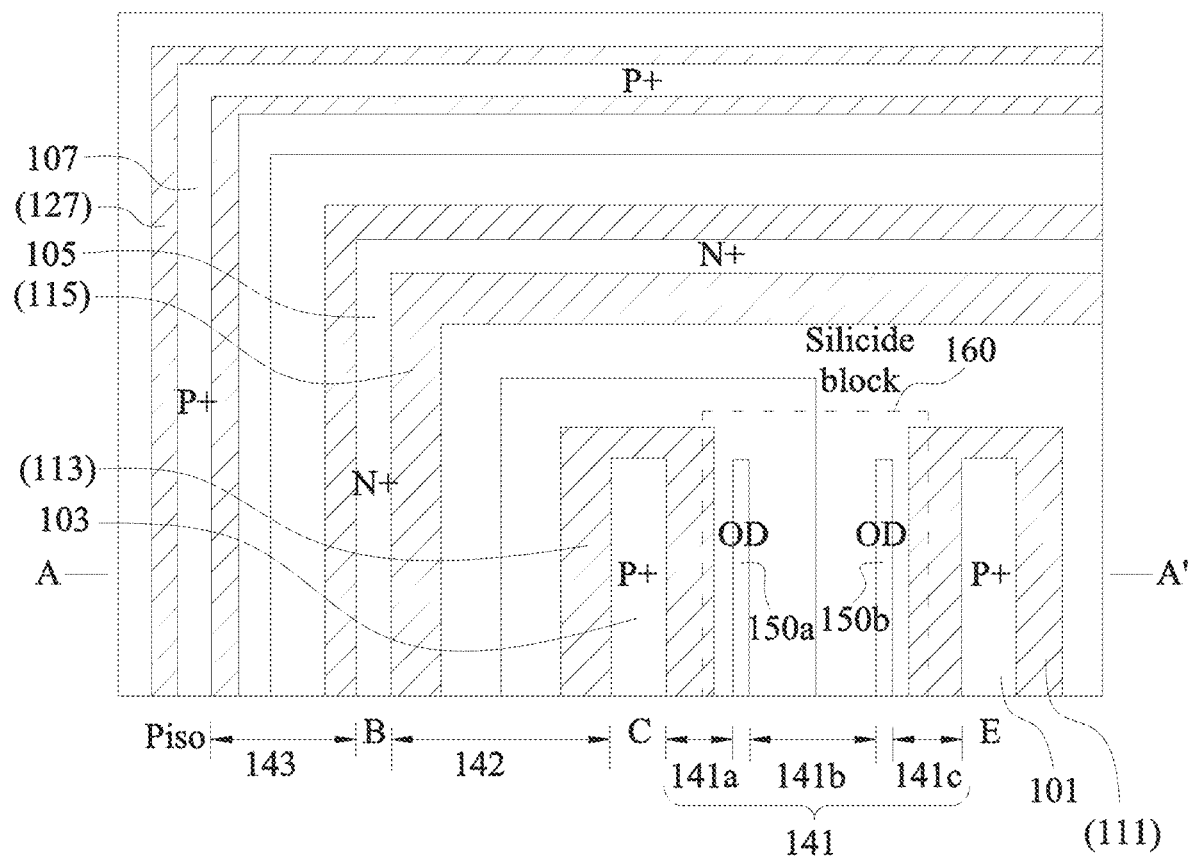
FIG. 1 shows an overhead layout diagram of a portion of a semiconductor structure in accordance with embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Moreover, like reference labels are used to designate like elements in the following discussion.

In the handling of semiconductor chip packages, ESD may result in damage to the semiconductor devices on the chip. On-chip protection circuits are used to provide a safe discharge path. The protection circuit is basically a switch that is off during normal circuit operation and on during an ESD event when a high voltage is present at a pin of the chip.

In high-voltage applications, ESD protection circuits are of particular importance. ESD protection circuits may include ESD power clamps coupled between high voltage power nodes and electrical grounds. Conventional ESD protection devices frequently utilize a parasitic bipolar-junction transistor (BJT) mechanism, where the ESD current conduction mechanism is triggered upon an avalanche breakdown of a reverse-biased junction thereof.

A conventional ESD protection device for high voltage applications often includes a high voltage n-well region and a high voltage p-well region next to, and in contact with, each other. A first shallow n-well region and a second shallow n-well region are formed in the high voltage n-well region and the high voltage p-well region, respectively. The high voltage n-well region and the high voltage p-well region are further located over an n-type buried layer. An isolation structure, such as shallow trench isolation (STI) feature, is disposed between the first and the second shallow n-well regions, and extends from the high voltage n-well region to the high voltage p-well region. The ESD protection device may further include a heavily doped diffusion region respectively arranged in the shallow n-well and p-well regions to correspondingly define an emitter node and a collector node. The structure recited above forms a bipolar junction transistor (BJT) that may be triggered on to conduct ESD currents when there is an ESD transient on VDD.

The isolation structure arranged between the two shallow well regions of opposite dopant types not only electrically isolates the emitter and the collector of the device, but also facilitates the formation of an ESD discharge path at a deeper depth in a substrate. The deeper discharge path under the isolation structure possesses an equivalent resistance that is utilized as a ballasting resistance that helps to raise a base voltage level in the substrate upon an ESD strike. An elevated voltage level in the substrate in turn reduces a breakdown threshold of the bipolar junction of the ESD protection device, thereby allowing easier triggering of the ESD protection mechanism.

To achieve an economical utilization of the limited area budget on a chip, an ESD protection device often employs a multi-finger configuration, in which the collector region and the emitter region of the device are implemented in the form of a series of abreast-extending, alternatively-patterned features with isolation structures arranged there-between. Each of the finger structure inherently constitutes a BJT that is capable of providing a releasing path for an ESD transient when triggered on. The overall robustness of an ESD protection device, particularly in high voltage applications, depends significantly on the uniform turn-on characteristics of these multiple finger structures. The uniform turn-on capability among the BJTs in the multiple finger structures is a major factor in the proper functioning of an ESD protection device, as a higher number of triggered fingers may cooperatively share the heavy load of an ESD transient.

However, there are a few causes contributing to the non-uniform turn-on issue in a parasitic BJT-based multi-finger ESD protection device. One of such causes is the varying base-ground path between each of the multi-fingers yielding different base resistance (e.g., substrate resistance, Rsub). Particularly, a longer base-ground path provides a larger resistance value. A larger substrate resistance contributes to a steeper rise in local base voltage, thus prematurely triggering some finger structures before others. The other cause is the snapback characteristics of the parasitic lateral BJT inherent in the multi-finger structures of the ESD protection devices that tends to make the first turned-on finger sustain the high ESD current all by itself.

The fluctuations/variations in the structural profiles of the numerous isolation structures in a multi-finger ESD device is also a cause of the undesirable non-uniform turn-on issue. As mentioned above, an isolation structure in a finger of a BJT-based ESD device introduces an intrinsic ballasting resistance to an ESD discharge path. The elevation of the base voltage in the substrate in turn reduces a breakdown threshold of the ESD protection mechanism. Accordingly, profile fluctuations/variations among the fingers of a multi-finger ESD device (e.g., may be the result of process-related issues such as microloading and/or proximity effects) is found to be another prominent cause of the non-uniform turn-on problem that leads to the degradation of ESD performance in a multi-finger device.

For instance, the microloading effect manifests itself as the differences in feature profiles and etch-depths between regions of high feature density and regions of low feature density on a substrate in which the features are provided. Also, during certain etching processes, features having narrower widths may form steeper side wall profiles than that of their wider counterparts due to a more pronounced ion scattering effect in a feature of higher aspect ratio (e.g., a narrow blind hole in a substrate). Moreover, insufficient design windows also contribute to the cause of structural variations in an ESD protection device.

Figure 2:
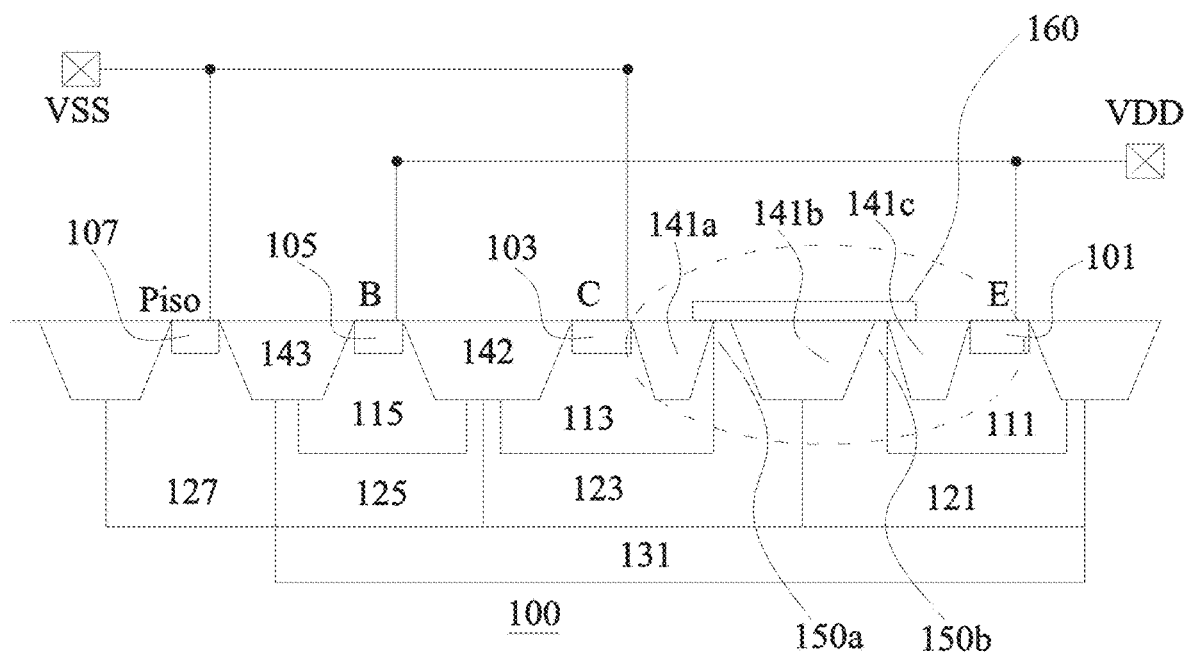
FIG. 2 is a schematic illustration showing a lateral cross-sectional view of a portion of a semiconductor structure in accordance with embodiments of the instant disclosure.

FIG. 1 shows an overhead layout diagram of a portion of a semiconductor structure in accordance with embodiments of the instant disclosure. FIG. 2 is a schematic illustration showing a lateral cross-sectional view of a portion of a semiconductor structure in accordance with embodiments of the instant disclosure. FIGS. 1 and 2 cooperatively provide a comprehensive illustration of the structural arrangement of an exemplary semiconductor device. In order to ensure a better illustration of the structural arrangement, FIG. 1 employs a partial see-through view to shown certain under surface features that otherwise would be hidden from a conventional planar view (e.g., feature such as the shallow n-well 111/115 and shallow p-well 113 shown in parenthesis). However, certain features in a deeper level of the device substrate are not shown in the planar view of FIG. 1 to ensure clarity (e.g., the high voltage n-wells 121/125, etc).

Particularly, FIGS. 1 and 2 respectively illustrate a regional view of an upper left corner of a p-n-p ESD cell of a protection device. The semiconductor structure comprises a substrate 100 of a first dopant type. In the instant example, a substrate of positive dopant type (e.g., a p-sub) is utilized.

A barrier layer of a second dopant type 131 (e.g., an n-type barrier layer) is provided in the substrate 100. In some embodiments, the barrier layer 131 is formed by implanting a top portion of the substrate 100 with an n-type impurity, for example, to a dopant concentration of between about $10^{16}/cm^3$ and about $10^{18}/cm^3$.

Above the barrier layer 131 a plurality of laterally adjacently arranged well regions of alternating dopant types is provided. Particularly, from right to left, the exemplary semiconductor structure comprises a first well structure of the second dopant type (e.g., n-type) that includes a high voltage n-well (HVNW) 121 and a shallow n-well (SHN) 111; a second well structure of the first dopant type (e.g., p-type) that includes a high voltage p-well (HVPW) 123 and a shallow p-well (SHP) 113; a third well structure of the second dopant type (e.g., n-type) that includes an HVNW 125 and a SHN 115; and a fourth well structure of the first dopant type (e.g., p-type) that includes an HVPW 127.

In some embodiments, the high voltage well regions (e.g., the HVNWs 121, 125 and/or the HVPWs 123, 127) may be provided by an epitaxy layer (not explicitly shown) provided on the substrate 100 and over the barrier layer 131. Such an epitaxy layer may be epitaxially grown on the substrate 100 after the formation of the barrier layer 131. The high voltage well regions may be formed by implanting the epitaxy layer with suitable dopant type and dopant concentration. For instance, to form a HVPW, a selected region in the epitaxy layer may be provided with a positive impurity concentration of between about $10^{13}/cm^3$ and about $10^{17}/cm^3$, although different dopant concentration may be used to meet specific design requirements. Likewise, to form an HVNW, a selected region in the epitaxy layer may be provided with a negative impurity of a comparable concentration level. In other embodiments, the high voltage well regions are formed by implanting the substrate 100 instead of using an epitaxy layer.

At least some of the adjacently connected well structures are arranged overlaying the barrier layer 131 from above and connected there-to. For instance, in the present example, the first well structure (e.g., SHN 111, NVNW 121) is arranged above and at least partially overlaying the barrier layer 131, and is in structural contact there-to. Similarly, the second well structure (e.g., SHP 113, HVPW 123) is arranged at least partially overlaying the barrier layer 131 and in connection there-with. Likewise, the third well structure (e.g., SHN 115, HVNW 125) is arranged at least partially overlaying the barrier layer 131 from above and in contact there-to. In comparison, the HVPW 127 is configured to function as a substrate contact region and need not be overlayingly arranged in the lateral planar coverage of the barrier layer 131. Specifically, the HVPW 127 may have a small portion overlaying/contacting the barrier layer 131 but is generally arranged at an outer planar periphery defined there-by.

The shallow well regions (e.g., SHN 111) are provided with higher dopant concentration than the corresponding high voltage wells (e.g., HVNW 121) in which they lie. For instance, in some embodiments, the n-type impurity of the SHN 111 may be more than one order (10 times) higher than that of the HVNW 121. In some embodiments, the n-type dopant concentration of the SHN regions may be between about $10^{15}/cm^3$ and about $10^{18}/cm^3$. Likewise, comparable arrangements may be adapted to the well structure of positive dopant type.

A highly doped diffusion region of suitable conductivity type is respectively arranged in the well structures. Specifically, the exemplary structure comprises a diffusion region 101 of a first dopant type (e.g., a p+ region) arranged in the SHN 111 of the first well structure at a surface region thereof; a diffusion region 103 of a first dopant type (e.g., p+) arranged in the SHP 113 of the second well structure at a surface region thereof; a diffusion region 105 of a second dopant type (e.g., n+) arranged in the SHN 115 of the third well structure; and a diffusion region 107 of a first dopant type (e.g., p+) arranged in the HVPW 127 of the fourth well structure. The diffusion regions may be accessibly arranged to enable establishment of electrical connections thereto (e.g., through via and/or interconnects). In the instant example, the diffusion regions 101 and 103 are respectively connected to power supply node (VDD), while the diffusion regions 103 and 107 are connected to power supply node (VSS).

The diffusion region 101 of a positive dopant type defines an emitter node of the p-n-p BJT ESD device. Specifically, the diffusion region 101 of heavy positive dopant type and the negatively doped first well structure (SHN 111, HVNW 121) cooperatively form a first p-n junction of the BJT ESD device. Likewise, the border between the first well structure of negative dopant type and the adjacent second well structure of positive dopant type forms a second p-n junction of the BJT ESD device. Accordingly, the diffusion region 103 of heavy positive dopant type arranged in the positively doped second well structure (e.g., SHP 113, HVPW 123) defines a collector node of the BJT-based ESD device. Cooperatively, the emitter node (e.g., region 101) and the collector node (e.g., region 103 and the associated p-type regions) form a "finger" of the ESD device.

In an ESD protection device that employs a multi-finger structural layout, there may be a plurality of alternating collector regions and emitter regions arranged substantially abreast of each other, in a fashion similar to that shown by the diffusion regions 101 and 103. Moreover, the diffusion region 105 of heavy negative dopant type in the third well structure of the same negative conductivity type (e.g., SHN 115, HVNW 125) defines a base region, while the diffusion region 107 of heavy positive dopant type in the fourth well structure of the same positive conductivity type (e.g., HVPW 127) defines a substrate contact region of the exemplary p-n-p BJT ESD device.

From a planar perspective, each of the emitter and collector regions (e.g., diffusion regions 101, 103) comprises an elongated profile that extends abreast each other in a substantially parallel fashion, as shown in FIG. 1. Such an arrangement may enable a higher feature density for a multi-finger structure that in turn facilitates economical utilization of limited space/area budget in a chip. Moreover, the diffusion region 105, which acts as a base region of the exemplary BJT based ESD device, is provided with an substantially rectangular annular profile surrounding one or more pairs of collector and emitter regions (e.g., as defined by regions 101/103). Furthermore, the diffusion region 107, which acts as a substrate contact region for the exemplary ESD device, may be realized in the form of a positive type guard ring (more apparent from the overhead view of FIG. 1) disposed around the base region and connected to the VSS. However, arrangements other than that illustrated in the instant figures may also be used. For example, instead of a substantially linear pattern, the elongated diffusion regions 101/103 may assume curvilinear, annular, or other patterns suitable for particular application/design requirements. The planar shape and profile of the base region may also be adjusted accordingly to match that of the emitter/collector region.

In addition, an isolation structure (e.g., region 141) is provided between the first and second well structures (e.g., 111/121; 113/123) of opposing dopant types, separating the emitter and collector nodes (e.g., regions 101, 103). In a planar perspective, the isolation structure 141 comprises an elongated profile and has at least a section extending along and between the elongated emitter and the collector regions (e.g., regions 101, 103). A similar isolation arrangement is provided between the second and the third well structures (e.g., 113/123; 115/125) to separate diffusion regions 103 and 105 (e.g., isolation structure 142), as well as between the third and the fourth well structures (113/123; 115/125) to separate diffusion regions 105 and 107 (e.g., isolation structure 143). The isolation structure may be shallow trench isolation (STI) features. In practice, some of the isolation structures may be in connection with one another in a global planar perspective. For instance, the isolation structure 141 is in connection with the isolation structure 142 through the periphery region enclosed within the rectangular annular diffusion region 105 (as shown in FIG. 1). The specific pattern arrangement of the isolation structures may be adjusted to suit a particular design requirement, and thus need not be limited to the exemplary illustration provided herein.

While the isolation structures (e.g., STI 141, 142, etc.) are arranged in a surface region of the substrate to separate the diffusion regions (e.g., 101, 103 etc.), they generally do not extend deep under the surface to fully divide the well structures underlay the diffusion regions. Accordingly, the well structures (e.g., 111/121, 113/123, etc.) may be in connection with one another under the corresponding isolation structures (e.g., 141).

One or more partition structures (e.g., 150a/b) are provided in the isolation structure 141 between the emitter and the collector regions (e.g., regions 101/103) to adjust a feature profile thereof that in turn modifies a ballasting (resistance) characteristics of the isolation structure. The partition structure may be dummy active regions (OD) suitably patterned in the isolation region (e.g., STI region 141) that separates the emitter node (e.g., 101) and the collector node (e.g., 103) of a finger structure. Particularly, in the instant example, a pair of partition structures 150a, 150b of elongated strip profile are inserted in the isolation region (e.g., 140) between the emitter and the collector regions (e.g., 101/103), with each of the partition structures extending substantially parallel to a corresponding emitter/collector region. Moreover, partition structure 150a is arranged proximate the collector node (e.g., region 103), while the partition structure 150b is arranged proximate the emitter node (e.g., region 101).

The insertion of the partition structures 150a/b in the isolation feature (e.g., STI 140) between the emitter and the collector of the ESD protection device modifies a local feature density there-between. Particularly, the feature density of an originally wide and unpopulated isolation region (e.g., 141) between the collector and emitter regions (e.g., diffusion regions 103/101) is therefore increased by the insertion of the partition structures (e.g., 150a, 150b). The two partition structures 150a/b in the instant example substantially divide the isolation structure 140 into three locally separated portions (i.e., portions 141a/b/c) in a lateral cross-section (e.g., along line A-A').

In addition, a silicide block 160 (which may comprise an electrically insulating material such as a nitride) may be provided on the isolation structure 140 between the emitter (e.g., region 101) and collector (e.g., region 103) to provide additional insulation there-between. Likewise, one or more implant blocking structure (not shown) may also be implemented between the isolation structures.

Figure 3A:
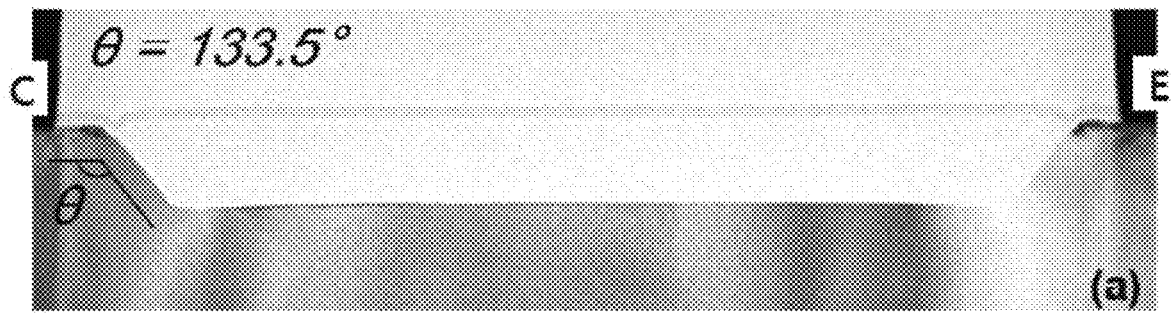
FIGS. 3(a)-3(c) show lateral cross-sectional views of a portion of a semiconductor structure in accordance with embodiments of the instant disclosure.
Figure 3B:
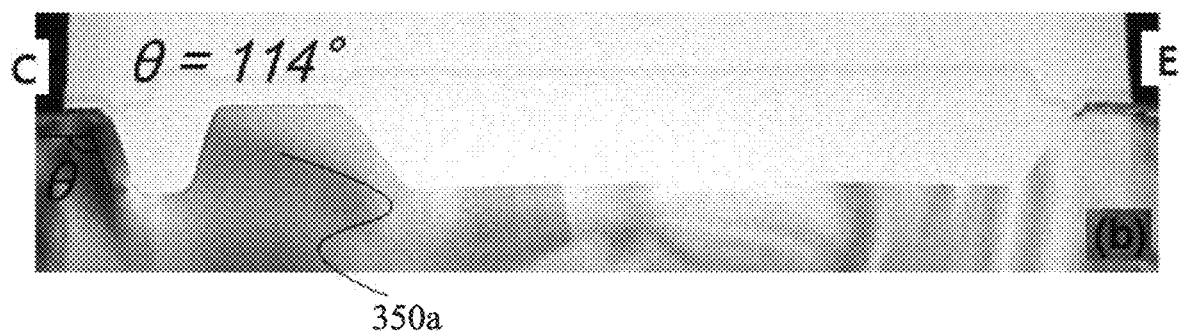
Figure 3C:
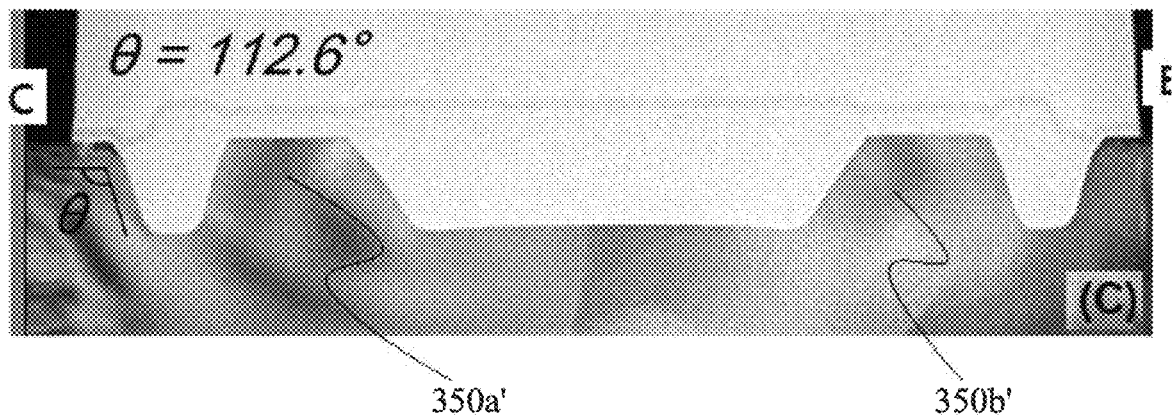

FIGS. 3(a)-3(c) show lateral cross-sectional views of a portion of a semiconductor structure in accordance with embodiments of the instant disclosure. Specifically, FIGS. 3(a)-3(c) show transmission electron microscopy (TEM) cross-section images of an isolation structure (e.g., 140 of FIGS. 1 and 2) between the emitter and collector regions (e.g., 101/103) according to different partition arrangements.

FIG. 3(a) shows an isolation region (e.g., 140) that does not comprise partition structures. Due to a lower feature density in the isolation region, the effect of process variations (such as micro-loading and/or proximity effects) becomes more prominent, which results in a less inclined side wall angle (e.g., deviating from an ideal side wall angle of 90 degrees with respect to a planar surface of the substrate) in the isolation structure profile. Specifically, the side wall of the isolation feature exhibits a down-slope angle of about 133.5° that is equivalent to an incline angel of about 46.5° with respect to the planar surface of the substrate.

FIG. 3(b) shows in isolation region (e.g., 140) that is provided with a partition structure 350a arranged proximate the collector (C) region of a finger structure. The partition structures 350a may be realized by a strip-profile OD region patterned in the isolation region between the emitter and the collector. The insertion of the partition structure 350a accordingly divides the isolation structure into two partitions (though an upper surface portion of the partitions may remain in connection with one another) and increases a local feature density therein that results in a steeper side wall angle with respect to a planar surface of the substrate in the isolation structure profile. Specifically, the side wall of the isolation feature (at the left hand side) exhibits a down-slope angle of about 114° that is equivalent to an incline angel of about 66° with respect to the planar surface.

FIG. 3(c) shows in isolation region (e.g., 140) that is provided with a pair of partition structures 350a', 350b' respectively arranged proximate an emitter (E) and collector (C) regions of a finger structure. The insertion of the partition structures 350a'/b' accordingly divide the isolation structure into three partitions (though an upper surface portion of the partitions may remain in connection with one another) and further increases a local feature density in the isolation structure that results in a steeper side wall angle with respect to a planar surface of the substrate in the isolation structure profile. Specifically, the side wall of the isolation feature exhibits a down-slope angle of about 112.6° that is equivalent to an incline angel of about 67.4° with respect to the planar surface.

Accordingly, the partition structures disclosed herein (in FIGS. 3(b) and 3(a), for example) affects a steeper slope on a lateral surface of the isolation structure bordering at least one of the emitter region and the collector region. Moreover, a higher local feature density in the isolation structure contributes to the formation of a steeper lateral profile, making a side wall thereof closer to an ideal vertical profile (e.g., 90° with respect to the planar surface).

Figure 4:
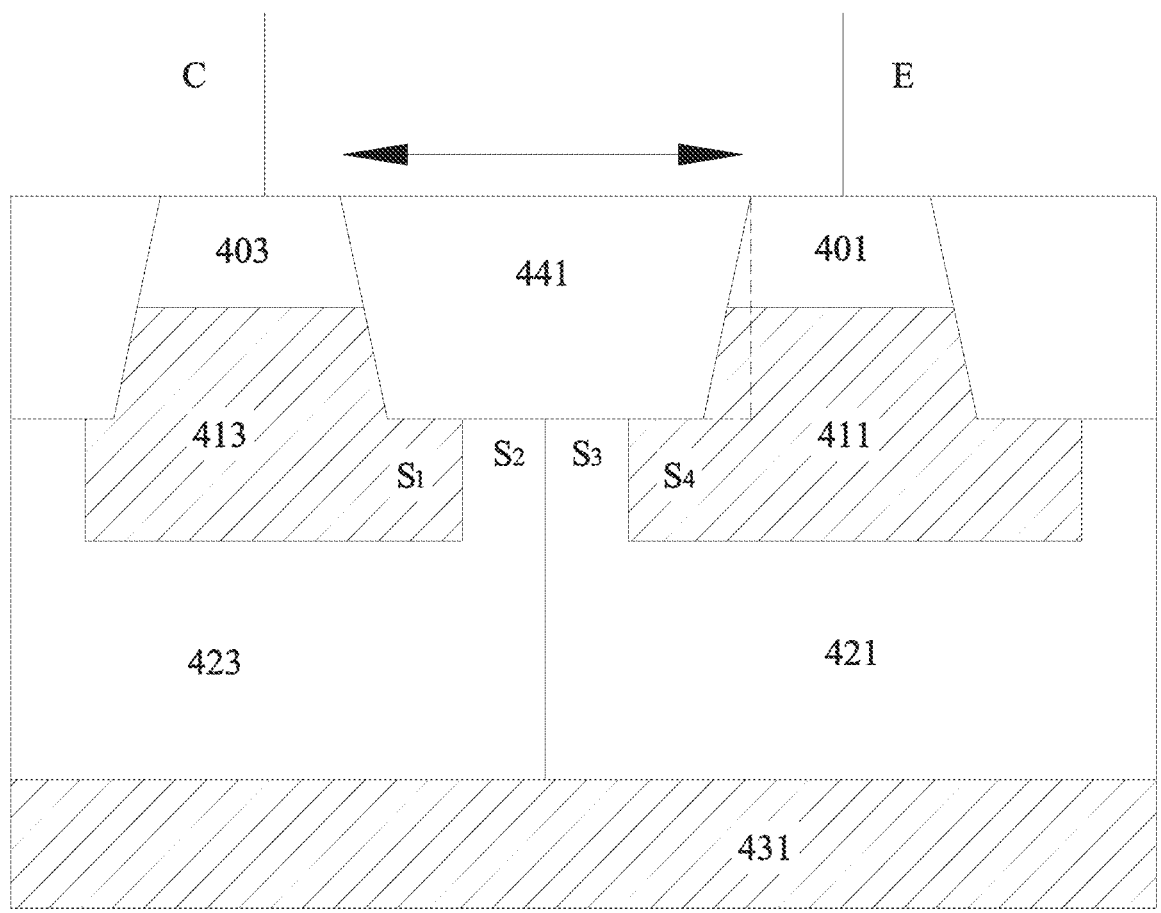
FIG. 4 is a schematic illustration showing a lateral cross-sectional view of a partial structure of a semiconductor ESD protection device.

FIG. 4 is a schematic illustration showing a lateral cross-sectional view of a partial structure of a semiconductor ESD protection device. Particularly, FIG. 4 provides a regional view of an isolation structure 441 arranged between a first diffusion region 401 and a second diffusion region 403 that respectively define an emitter and a collect of an ESD device. Each of the diffusion regions is respectively arranged in a corresponding well structure (e.g., a first well structure that comprises a shallow well region 411 and a high voltage well region 421; and a second well structure that comprises a shallow well region 413 and a high voltage well region 423). A barrier layer 431 is arranged under the first and second well structures in contact there-with.

The side wall profile of the isolation feature correspondingly affects a lateral length under the isolation structure 441 that in turn generates different ballasting resistance characteristics. Specifically, the lateral width under the exemplary isolation structure 441 is divided into four segments S1-S4. Segment S1 corresponds to a width of the isolation structure in the shallow well 413; segment S2 corresponds to a width of the isolation structure in the high voltage well 423; segment S3 corresponds to a width of the isolation structure in the high voltage well 421; and segment S4 corresponds to a width of the isolation structure in the shallow well 411. As can be seen, a steeper side wall profile in the isolation region generally results in a wider lateral segment (as shown by the dashed line at S4) that translates to a longer discharge path. A longer discharge path inherently provides a larger parasitic resistance that helps to boost the base voltage in a finger structure device during an ESD event and facilitates the attainment of the trigger voltage. Accordingly, applying the profile optimization mechanism of the instant disclosure to the fingers of a multi-finger BJT-based ESD device may improve a global ballasting characteristic thereof that facilitates uniform turn-on of the finger structures. The overall robustness of the ESD protection device may therefore be improved.

Figure 5:
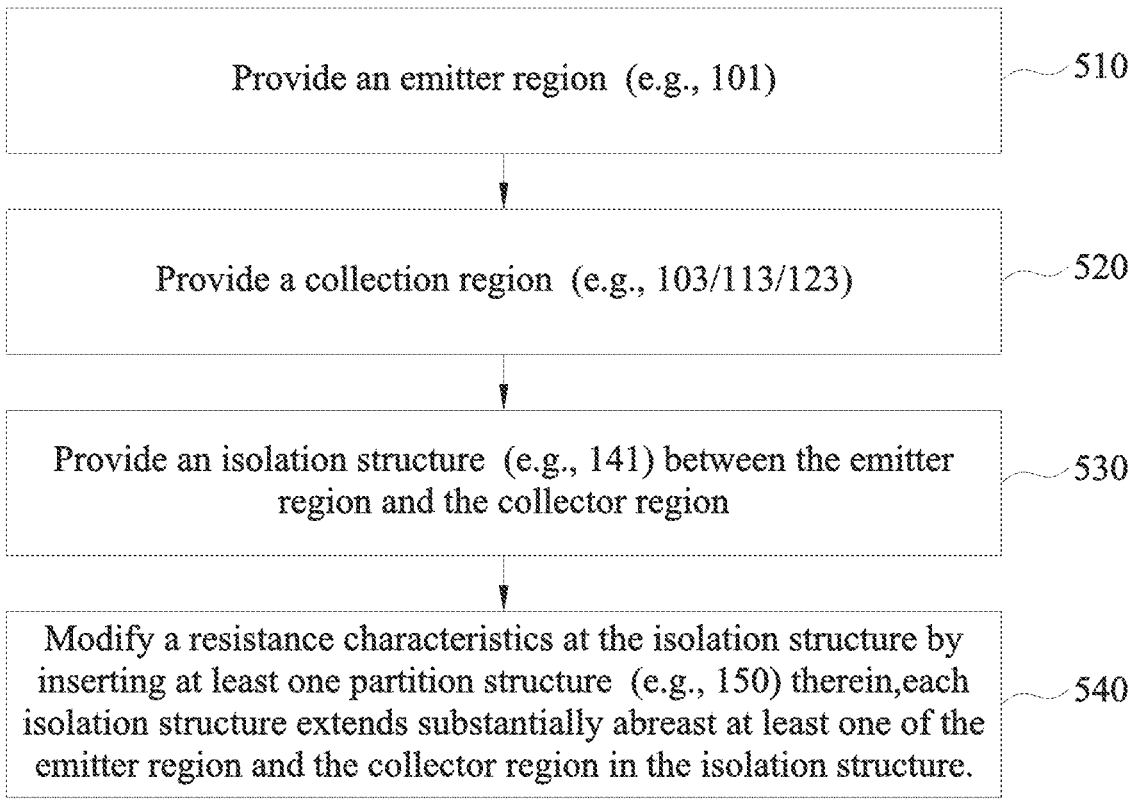
FIG. 5 is a flow chart of a method of enhancing robustness of a semiconductor ESD device in accordance with embodiments of the instant disclosure.

FIG. 5 is a flow chart of a method of enhancing robustness of a semiconductor ESD device in accordance with embodiments of the instant disclosure. Particularly, in a process 510, an emitter node (e.g., region 101) is accessibly provided on a substrate. In a process 520, a collection node (e.g., region 103) is provided adjacent to the emitter node. The emitter region and the collector region may be provided with elongated planar profile and cooperatively define a finger structure of a multi-finger ESD protection device. In a process 530, an isolation structure (e.g., STI 141) is provided between the emitter and the collector nodes. The isolation structure may be provided with an elongated planar profile and have at least a section thereof extending along and between the emitter and the collector regions.

The method further comprises a process 540, in which at least one partition structure (e.g., 150a/b) is provided in the isolation structure between the emitter and the collector regions. The partition structure may be a dummy OD region having a strip-like planar pattern and extend substantially abreast at least one of the emitter and collector regions. Moreover, the partition structure may be selectively provided proximate at least one of the emission and the collector regions. The partition structure affects a steeper slope on a lateral surface of the isolation structure bordering at least one of the emitter and the collector regions that in turn modifies a resistance characteristic at the isolation region between the emitter and collector. It is noted that, however, the specific order of the steps need not be limited to the instant example, but may be adjusted in compliance with the practical requirements of a particular fabrication process.

By utilizing the profile optimization mechanism in accordance with the instant disclosure, the ballasting characteristics of individual finger structures in a multi-finger ESD device may be improved. Accordingly, the improvement of the ballasting characteristics among the isolation structures may ensure an uniform turn-on across the multiple fingers that effectively alleviates the adverse effects caused by the process variations/design deficiencies and leads to an increased robustness of the ESD device.

Accordingly, one aspect of the instant disclosure provides a semiconductor structure that comprises: a first well structure; a second well structure arranged adjacent to the isolation structure in the substrate, a diffusion region respectively disposed in the first and the second well structures; an isolation structure arranged between the well structures and laterally separating the diffusion regions; and a partition structure arranged in the isolation structure, wherein the partition structure modifies a ballasting characteristics of the isolation structure.

Accordingly, one aspect of the instant disclosure provide a method of enhancing robustness of a bipolar electrostatic discharge (ESD) device that comprises the acts of: providing an emitter region; providing a collector region adjacent to the emitter region; providing an isolation structure between the emitter region and the collector region; and modifying a ballasting characteristics at the isolation structure by inserting at least one partition structure therein, each isolation structure extends substantially abreast at least one of the emitter region and the collector region in the isolation structure.

Accordingly, another aspect of the instant disclosure provides an electrostatic discharge (ESD) protection device that comprises: a first diffusion region of a first dopant type disposed in a first well structure of a second dopant type, defining an emitter; a second diffusion region of the first dopant type disposed in a second well structure of the first dopant type arranged adjacent to the first well structure, defining a collector; a third diffusion region of the second dopant type disposed in a third well structure of the second dopant type arranged adjacent to the second well structure, defining a base; an isolation structure arranged between the first and the second well structures, laterally separating the emitter and the collector; and a partition structure arranged in the isolation structure, wherein the partition structure modifies a ballasting characteristics of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a bipolar junction transistor comprising:
        a base region connected to a power supply node;
        an emitter region connected to the power supply node; and
        a collector region between the emitter region and the base region, the collector region connected to a ground node; and
    an isolation structure between the emitter region and the collector region, the isolation structure comprising a first partition structure extending substantially abreast at least one of the emitter region and the collector region.

2. The device of claim 1, wherein the first partition structure affects a steeper slope on a lateral surface of the isolation structure bordering at least one of the emitter region and the collector region.

3. The device of claim 1, wherein the emitter region and the collector region collectively define a finger structure of a multi-finger device.

4. The device of claim 1, wherein the emitter region and the collector region each have an elongated planar profile.

5. The device of claim 4, wherein the isolation structure has an elongated planar profile, and at least a section of the elongated planar profile of the isolation structure extends along and between the elongated planar profile of the emitter region and the elongated planar profile of the collector region.

6. The device of claim 1, wherein the first partition structure is disposed closer to one of the emitter region and the collector region than to the other of the emitter region and the collector region.

7. The device of claim 1, wherein the first partition structure comprises a dummy active region.

8. The device of claim 1, wherein a top surface of the first partition structure is covered by an insulator.

9. The device of claim 1, wherein the isolation structure further comprises a second partition structure extending substantially abreast at least one of the emitter region and the collector region.

10. A device comprising:
    a bipolar junction transistor comprising:
        an emitter region connected to a power supply node;
        a base region connected to the power supply node; and
        a collector region between the base region and the emitter region, the collector region connected to a ground node; and
    a first isolation structure comprising:
        a first portion proximate the emitter region;
        a second portion proximate the collector region; and
        a third portion between the first portion and the second portion, the third portion and the first portion separated by a first partition structure, the third portion and the second portion separated by a second partition structure, each of the first portion, the second portion, and the third portion disposed between the emitter region and the collector region.

11. The device of claim 10, further comprising:
    a second isolation structure disposed between the base region and the collector region.

12. The device of claim 10, wherein the first partition structure comprises a portion of the emitter region, and the second partition structure comprises a portion of the collector region.

13. The device of claim 10, wherein each of the first portion, the second portion, and the third portion of the first isolation structure have parallel longitudinal axes.

14. The device of claim 10, further comprising:
    an insulating material on the first portion, the second portion, and the third portion of the first isolation structure.

15. A device comprising:
    a first deep well of a first dopant type in a substrate;
    a first shallow well of the first dopant type in the first deep well;

a first diffusion region of a second dopant type in the first shallow well, the second dopant type being different from the first dopant type;

a second deep well of the second dopant type in the substrate, the second deep well adjoining the first deep well;

a second shallow well of the second dopant type in the second deep well;

a second diffusion region of the second dopant type in the second shallow well; and a first isolation structure comprising:
  a first portion in the first shallow well;
  a second portion in the second shallow well; and
  a third portion in the first deep well and the second deep well, a portion of the first deep well disposed between the third portion and the first portion of the first isolation structure, a portion of the second deep well disposed between the third portion and the second portion of the first isolation structure.

16. The device of claim 15 further comprising:
a third deep well of the first dopant type in the substrate, the third deep well adjoining the second deep well;

a third shallow well of the first dopant type in the third deep well;

a third diffusion region of the first dopant type in the third shallow well; and a second isolation structure in the third shallow well, the third deep well, the second shallow well, and the second deep well.

17. The device of claim 16, wherein the first diffusion region is connected to a power supply node, the second diffusion region is connected to a ground node, and the third diffusion region is connected to the power supply node.

18. The device of claim 15, wherein the first portion, the second portion, and the third portion of the first isolation structure each extend lengthwise in a same first direction along a major surface of the substrate.

19. The device of claim 15 further comprising:
an insulating material on the first portion, the second portion, and the third portion of the first isolation structure.

20. The device of claim 15, wherein the first diffusion region is connected to a power supply node and the second diffusion region is connected to a ground node.

* * * * *